(12) United States Patent
Nemoto et al.

(10) Patent No.: US 7,709,932 B2
(45) Date of Patent: May 4, 2010

(54) SEMICONDUCTOR WAFER HAVING A SEPARATION PORTION ON A PERIPHERAL AREA

(75) Inventors: Yoshihiko Nemoto, Tokyo (JP); Masahiro Sunohara, Nagano (JP); Kenji Takahashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 307 days.

(21) Appl. No.: 11/245,059

(22) Filed: Oct. 7, 2005

(65) Prior Publication Data
US 2006/0038260 A1 Feb. 23, 2006

Related U.S. Application Data

(62) Division of application No. 10/751,657, filed on Jan. 6, 2004, now Pat. No. 7,195,988.

(30) Foreign Application Priority Data
Jul. 1, 2003 (JP) ............................. 2003-189574

(51) Int. Cl.
*H01L 29/06* (2006.01)
(52) U.S. Cl. ................ 257/618; 257/619; 257/620; 257/622; 257/623; 257/E21.238; 257/E21.599; 257/E29.022
(58) Field of Classification Search ................ None
See application file for complete search history.

(56) References Cited
U.S. PATENT DOCUMENTS 4,630,093 A * 12/1986 Yamaguchi et al. ........ 428/66.7
5,225,235 A * 7/1993 Yoshiharu et al. .......... 428/66.7
5,821,166 A * 10/1998 Hajime et al. ............... 438/691
5,937,312 A 8/1999 Iyer et al.

(Continued)

FOREIGN PATENT DOCUMENTS

JP 4-85827 3/1992

(Continued)

OTHER PUBLICATIONS

Japanese Office Action issued in Japanese Patent Application No. JP 2003-189574, mailed Jul. 15, 2008.

*Primary Examiner*—Zandra Smith
*Assistant Examiner*—Khanh B. Duong
(74) *Attorney, Agent, or Firm*—McDermott Will & Emery LLP

(57) ABSTRACT

A conveyance system for a semiconductor wafer can be used without any change before and after a support plate is adhered to the wafer. Also, the finish accuracy of the wafer and the positioning accuracy between the wafer and the support plate can be relaxed, thus improving the manufacturing efficiency. The wafer is formed on its peripheral portion with a stepped portion, which is deeper than a finished thickness obtained by partial removal of the rear surface thereof and which can be eliminated by the partial removal of the wafer rear surface. The separation portion has a length which extends radially outward from a flat surface, and which is greater than a total sum of a maximum-minimum difference between the finish allowances of the diameters of the wafer and the support plate, and a maximum value of a positioning error between the wafer and the support plate generated upon adhesion thereof.

1 Claim, 13 Drawing Sheets

U.S. PATENT DOCUMENTS

| | | |
|---|---|---|
| 6,291,315 B1 | 9/2001 | Nakayama et al. |
| 6,294,019 B1 * | 9/2001 | Miura et al. ................... 117/96 |
| 7,258,931 B2 * | 8/2007 | Kim et al. ................... 428/641 |
| 2001/0051432 A1 | 12/2001 | Yano et al. |

FOREIGN PATENT DOCUMENTS

| | | |
|---|---|---|
| JP | 4-196340 | 7/1992 |
| JP | 6-215993 | 8/1994 |
| JP | 10-270298 | 10/1998 |
| JP | 10-335195 | 12/1998 |
| JP | 11-312732 | 11/1999 |
| JP | 2000-173961 A | 6/2000 |
| JP | 2001-345435 | 12/2001 |
| JP | 2002-343972 | 11/2002 |

* cited by examiner

FIG. 8 ( I )
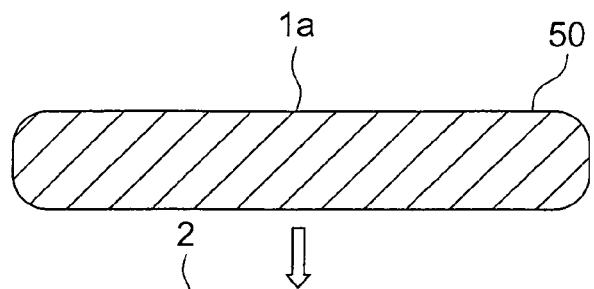
FIG. 8 ( II )
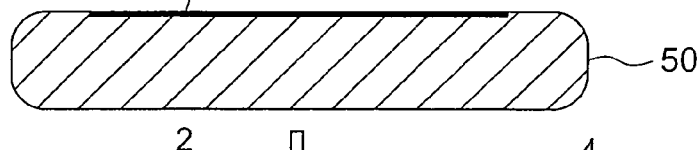
FIG. 8 ( III )
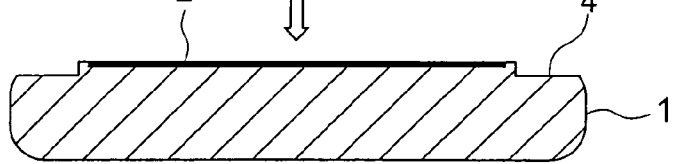
FIG. 8 ( IV )
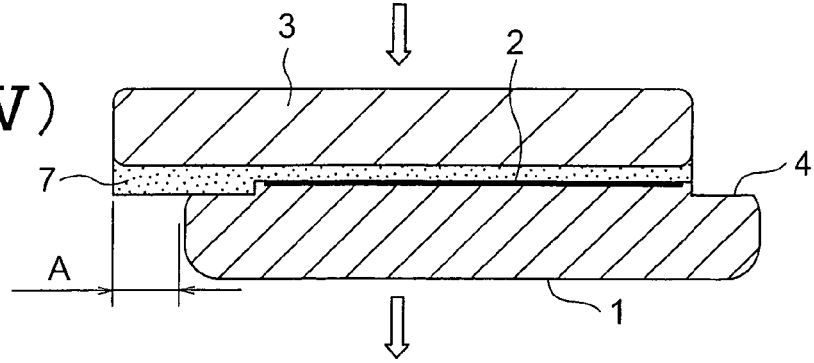

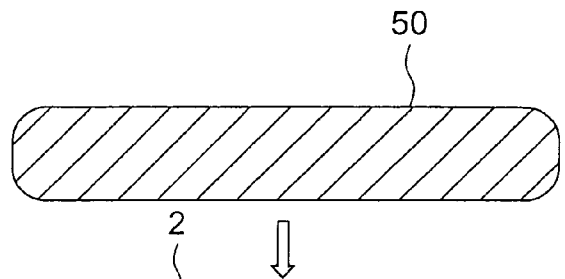
FIG. 9 ( I )
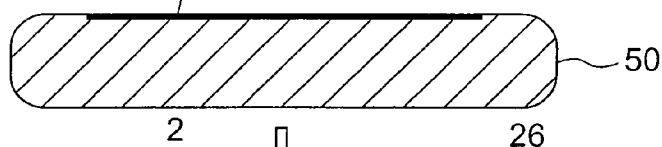
FIG. 9 ( II )
FIG. 9 ( III )
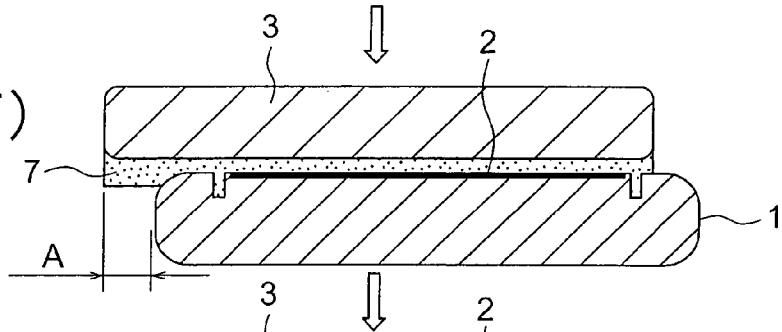
FIG. 9 ( IV )
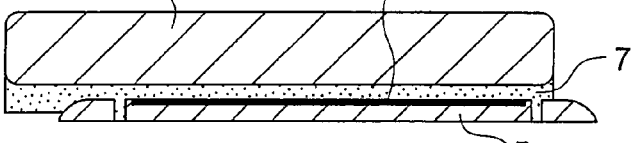
FIG. 9 ( V )
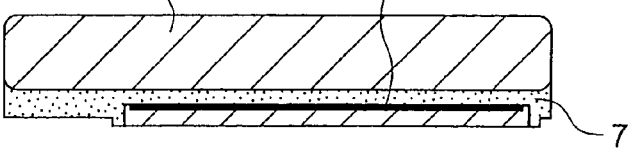
FIG. 9 ( VI )

FIG. 10 (I)
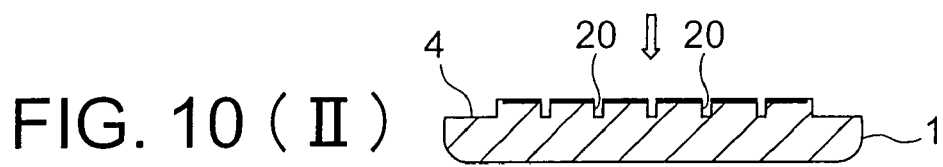
FIG. 10 (II)
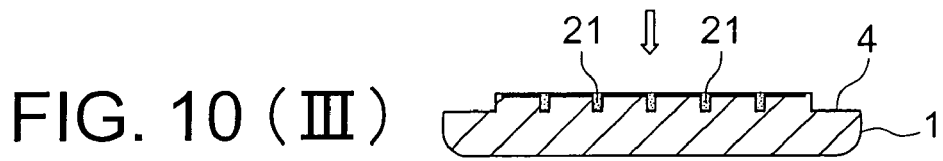
FIG. 10 (III)
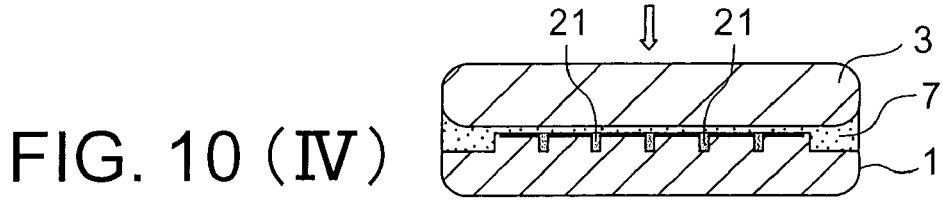
FIG. 10 (IV)
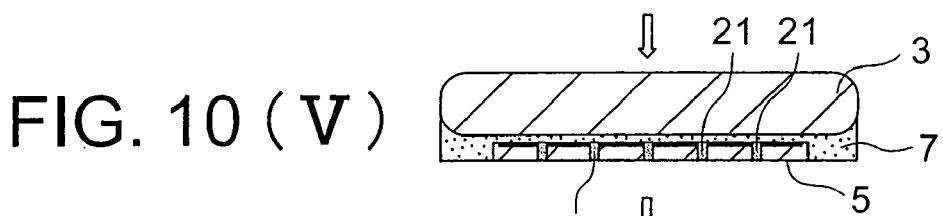
FIG. 10 (V)
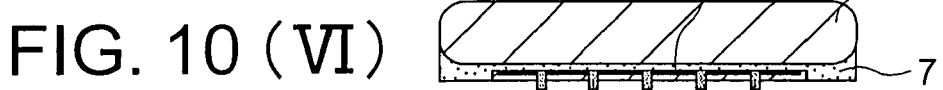
FIG. 10 (VI)
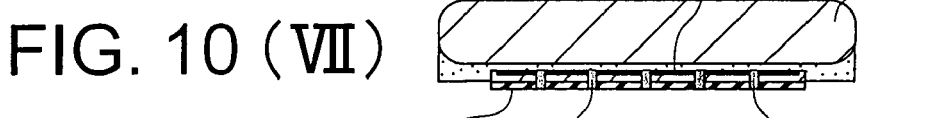
FIG. 10 (VII)
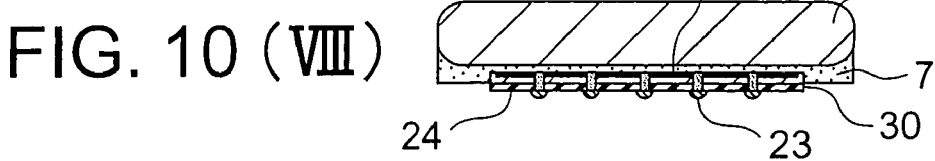
FIG. 10 (VIII)

SEMICONDUCTOR WAFER HAVING A SEPARATION PORTION ON A PERIPHERAL AREA

RELATED APPLICATIONS

This application is a divisional of application Ser. No. 10/751,657, filed Jan. 6, 2004, now U.S. Pat. No 7,195,988 which claims priority of Japanese Application No. 2003-189574, filed Jul. 1, 2003, the contents of which are hereby incorporated by reference.

BACKGROUND OF THE INVENTION

1. Field of the Invention

The present invention relates to a semiconductor wafer which has a support plate adhered to one or front surface thereof in the form of a flat surface with a semiconductor circuit formed thereon, and of which the other or rear surface is partially removed to reduce its thickness, and it also relates to a semiconductor device manufactured by using the semiconductor wafer as well as to a method of manufacturing semiconductor devices.

2. Description of the Related Art

In the past, there has been known a method for manufacturing semiconductor devices in which a support plate for reinforcing the mechanical strength of a semiconductor wafer is first attached or adhered to a flat front surface of the semiconductor wafer having a semiconductor circuit formed thereof, and then an opposite rear surface of the semiconductor wafer is partially removed to reduce its thickness, thereby providing the semiconductor devices. Such a method of manufacturing semiconductor devices is disclosed in Japanese patent application laid-open No. H10-335195, for example.

In this case, however, it is necessary to grind the rear surface of the semiconductor wafer to reduce the initial thickness thereof to about 1/10 thereof, and hence there arises the following problem.

That is, in general, semiconductor wafers having cleavage are highly brittle and are single crystal, so they are rapidly becoming easier to crack in accordance with the decreasing thickness thereof. Thus, it is extremely difficult to convey or transport the semiconductor wafers after they have been ground to a certain thickness or less. Therefore, each semiconductor wafer is attached or adhered to a support plate of a prescribed rigidity before grinding thereof. In this case, however, support plates adhered to semiconductor wafers, respectively, are made to have the same diameter as that of the semiconductor wafers adhered thereto due to the necessity of using in common the wafer conveyance or transportation system of processing equipment before and after the grinding of the rear surface of each semiconductor wafer. If, however, for instance, both of a semiconductor wafer and a support plate have a maximum amount of tolerance, the overall outside diameter of the semiconductor wafer and the support plate after adhered to each other will be increased by a positioning or registering error therebetween which would be generated upon adhering the support plate to the semiconductor wafer, so that it might become larger than an allowed entire outside diameter, thus resulting in difficulty in the handling thereof by a conveyance or transportation system of post-processing equipment. To avoid such a situation, there arises the following problem. That is, for instance, it is necessary to prepare jigs, attachments, etc., suited to fit the combined wafer and support plate into respective processing apparatuses, and in addition, it is also necessary to use or replace such jigs and attachments in individual cases, thus reducing the manufacturing efficiency.

Moreover, when the semiconductor wafer actually protrudes from the corresponding support plate, the protruded portion of the wafer is very easy to crack and would be causes of resultant defects and/or contamination, and hence the protruding of the semiconductor wafer from the support plate is not allowed in fact. As a result, extremely high accuracies are required in terms of the individual dimensions of the semiconductor wafer and the support plate as well as the total size or adhering positions thereof when they are adhered to each other.

SUMMARY OF THE INVENTION

The present invention is intended to obviate the above-mentioned problems, and has for its object to provide a semiconductor wafer in which a transportation system for the semiconductor wafer can be commonly used without any change before and after a support plate is adhered to the semiconductor wafer, and in which the finish accuracy of the semiconductor wafer and the positioning or registering accuracy of the semiconductor wafer and the support plate can be relaxed, thus making it possible to improve the efficiency of manufacturing semiconductor devices.

Another object of the present invention is to provide a semiconductor device which can be manufactured by using such a semiconductor wafer.

A further object of the present invention is to provide a method of manufacturing such a semiconductor device.

According to the present invention, there is provided a semiconductor wafer having a front surface which is a flat surface with a semiconductor circuit formed thereon and to which a support plate is adhered, and a rear surface of which is partially removed to reduce its thickness. On a peripheral portion of the semiconductor wafer, there is formed a separation portion which has a notch deeper than a finished thickness of the semiconductor wafer obtained by the partial removal of the rear surface thereof. The separation portion has a length which extends radially outward from the flat surface, and which is greater than a total sum of a maximum-minimum difference between the finish allowances of the diameters of the semiconductor wafer and the support plate, which has substantially the same diameter as that of the semiconductor wafer, and a maximum value of a positioning error between the semiconductor wafer and the support plate generated at the time of adhering them to each other.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIGS. 3(I) through 3(VI) are views showing further respective process steps of manufacturing the semiconductor devices according to the first embodiment of the present invention.

FIGS. 8(I) through 8(IV) are views showing respective process steps of manufacturing semiconductor devices according to a second embodiment of the present invention.

FIGS. 9(I) through 9(VI) are views showing respective process steps of manufacturing semiconductor devices according to a third embodiment of the present invention.

FIGS. 10(I) through 10(VIII) are views showing respective process steps of manufacturing semiconductor devices according to a fourth embodiment of the present invention.

DESCRIPTION OF THE PREFERRED EMBODIMENTS

Now, preferred embodiments of the present invention will be described in detail while referring to the accompanying drawings, with the same or corresponding parts or members thereof being identified by the same symbols throughout the following respective embodiments.

Embodiment 1

Figure 1:
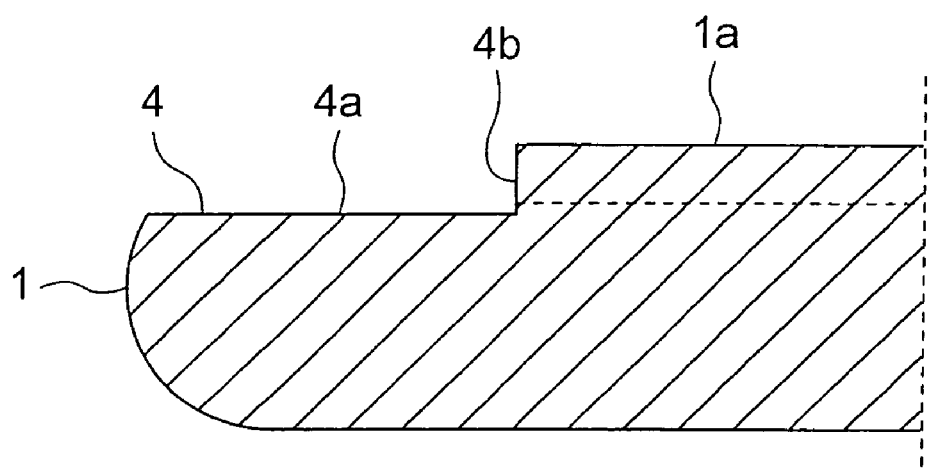
FIG. 1 is a partial cross sectional view of a semiconductor wafer according to a first embodiment of the present invention.

FIG. 1 is a partial cross sectional side view of a semiconductor wafer according to a first embodiment of the present invention. FIGS. 2(I) through 2(V) show respective process steps of a method of manufacturing semiconductor devices according to the first embodiment of the present invention. FIGS. 3(I) through 3(VI) shows respective process steps, subsequent to the process step of FIG. 2(V), of the method of manufacturing the semiconductor devices according to the first embodiment of the present invention.

The semiconductor wafer, generally designated at reference numeral 1, has one or front surface in the form of a flat surface 1a on which a semiconductor circuit 2 is formed, and to which a support plate 3 is attached or adhered, and the other or rear surface of which is ground to reduce its thickness. The semiconductor wafer 1 has a disk-shaped configuration, and is formed on the peripheral portion of the front surface thereof with a separation portion in the form of a stepped portion 4. The stepped portion 4 includes a notch having a vertical plane 4b vertically cut from the front surface of the wafer 1 and a bottom surface 4a horizontally cut into the vertical plane 4b. The bottom surface 4a of the stepped portion 4 has a rear surface that is deeper than the thickness of a base 5 after partially removed by grinding, and the width of the bottom surface 4a is larger than a total sum of a maximum-minimum difference between the finish allowances of the diameters of the semiconductor wafer 1 and the support plate 3, which has substantially the same diameter as that of the semiconductor wafer 1, and a maximum value of a positioning or registering error between the semiconductor wafer 1 and the support plate 3 generated at the time of adhering them to each other.

A plurality of semiconductor devices 12 are produced from the above-mentioned semiconductor wafer 1 through respective manufacturing process steps, which will be described in detail below.

Figure 2:
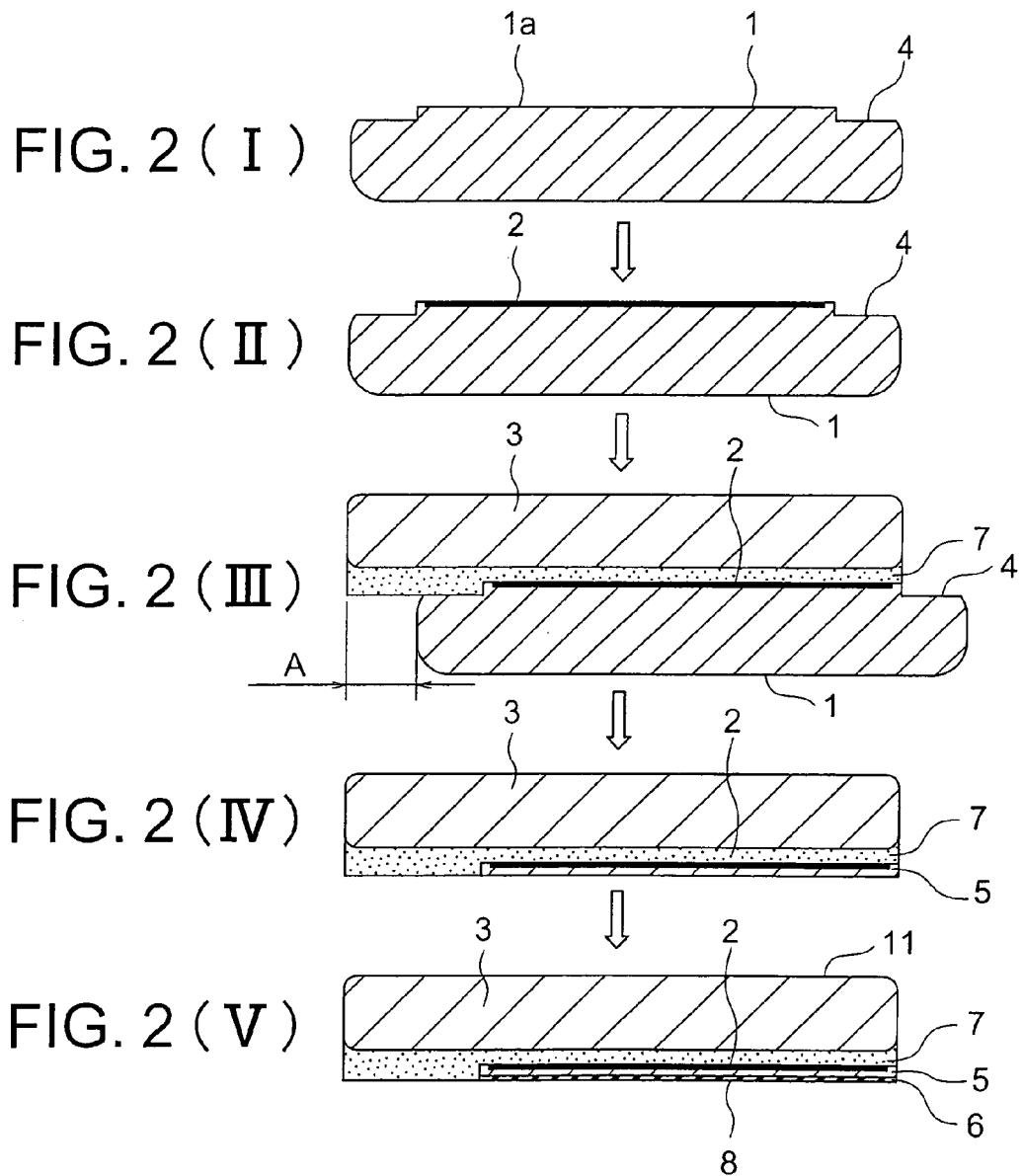
FIGS. 2(I) through 2(V) are views showing respective process steps of manufacturing semiconductor devices according to the first embodiment of the present invention.
Figure 3:
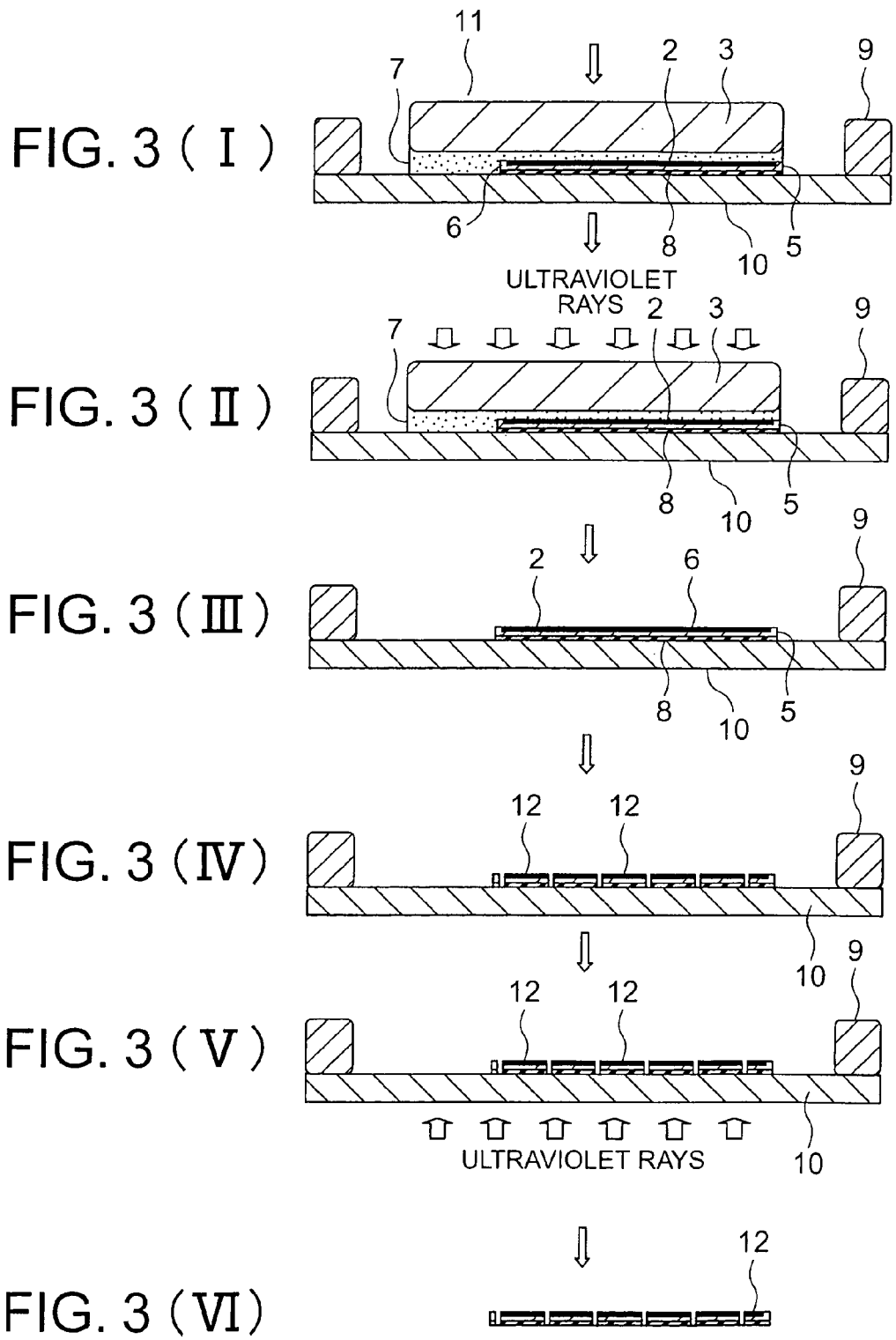

First of all, the peripheral portion of the front surface of a disk-shaped wafer main body is subjected to a step forming process to provide the stepped portion 4, thus forming the semiconductor wafer 1 (FIG. 2(I)). Then, the semiconductor circuit 2 is formed on the flat surface 1a of the front surface of the semiconductor wafer 1 (FIG. 2(II)). Thereafter, the support plate 3 having substantially the same diameter as that of the semiconductor wafer 1 is adhered or bonded to the front surface of the semiconductor wafer 1 having the stepped portion 4 by the use of an adhesive or binding material 7 (FIG. 2(III)). At this time, there might be caused an adhesion error A between the semiconductor wafer 1 and the support plate 3, as shown in this figure. Thereafter, the rear surface of the semiconductor wafer 1 is partially ground to remove the separation portion in the form of the stepped portion 4 until the thickness of the semiconductor wafer 1 is reduced to a finished thickness of about 1/10 of the initial thickness thereof, so that the base 5 is thereby formed (FIG. 2(IV)). Subsequently, an insulating film 8 is formed on the rear surface of the base 5 to provide a semiconductor device body 6 (FIG. 2(V)). As a result, a block 11 is formed in which the semiconductor device body 6 is fixedly secured to the support plate 3 by means of the binding material 7.

Continuously to this, the rear surface of the block 11 is adhered to a support film 10 that is arranged under tension on a lower surface of a ring-shaped frame 9 (FIG. 3(I)). Thereafter, ultraviolet rays are irradiated from a front surface side of the block 11 whereby the adhesive strength of the binding material 7 is lost, allowing the support plate 3 to be separated from the semiconductor device body 6 (FIGS. 3(II) and 3(III)). Then, the semiconductor device body 6 is divided by dicing to form a plurality of discrete semiconductor devices 12 (FIG. 3(IV)). Finally, by irradiating ultraviolet rays on the support film 10 from the rear surface thereof, the adhesive strength of an adhesive layer on the surface of the support film 10 is lost so that the semiconductor devices 12 are peeled off from the support film 10, thus completing the production of the semiconductor devices 12 (FIGS. 3(V) and 3(VI)).

In the semiconductor devices 12 of the above-mentioned construction, before performing a process of forming the semiconductor circuit 2, the stepped portion 4 having the notch is formed on the peripheral portion of the semiconductor wafer 1 in such a manner that the notch is deeper than the finished thickness of the semiconductor wafer 1 and wider than the total sum of the maximum-minimum difference between the finish allowances of the diameters of the semiconductor wafer 1 and the support plate 3, which has substantially the same diameter as that of the semiconductor wafer 1, and the maximum value of the positioning or registering error between the semiconductor wafer 1 and the support plate 3 generated at the time of adhering them to each other. Then, the semiconductor wafer 1 is ground after it is adhered to the support plate 3. As a result, the stepped portion 4 is eliminated or removed by the grinding process to form the base 5, the outer diameter of which is less by the radial length of the notch of the stepped portion 4 than the outer diameter of the semiconductor wafer 1. At this time, the width of the stepped portion 4 is set to be an appropriate value by taking into consideration of both of the errors including the finish allowances of the semiconductor wafer 1 and the support plate 3 and the positioning or registering error therebetween. Therefore, the base 5, after the rear surface of the semiconductor wafer 1 has been ground, does not protrude outward from the outer periphery of the support plate 3.

Accordingly, the conveyance or transportation system for the semiconductor wafer 1, which has substantially the same diameter as that of the support plate 3 and which is formed on the front surface thereof with the semiconductor circuit 2, can be used as it is, even in the respective process steps following the process step of forming the base 5 (FIG. 2(IV)).

In addition, the diameter of the block 11, after the rear surface of the semiconductor wafer 1 has been ground, is substantially the same as that of the support plate 3, and hence the dimensional accuracy of the diameter of the block 11 is decided by the dimensional accuracy of the diameter of the support plate 3. As a consequence, the finish accuracy of the semiconductor wafer 1 and the positioning or registering accuracy between the semiconductor wafer 1 and the support plate 3 are relaxed or mitigated.

Moreover, the size of the base 5 is smaller than the size of the support plate 3 in the process steps after the process step of FIG. 2(IV). Thus, by utilizing such a difference between these sizes, the support plate 3, when separated from the base 5, can be peeled off in a direction away from the support film 10 to which the base 5 is adhered, initially at a portion of the support plate 3 not overlapping with the base 5. As a result, workability in separating the support plate 3 from the base 5 can be improved in comparison with the case where a block comprising a base and a support plate, whose diameters are substantially the same with each other, is adhered to the support film 10.

Figure 4:
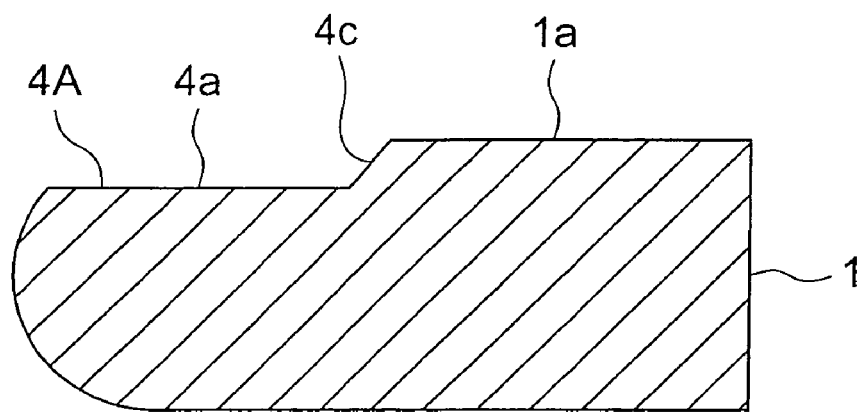
FIG. 4 is a partial cross sectional view showing another example of a semiconductor wafer according to the first embodiment of the present invention.
Figure 5:
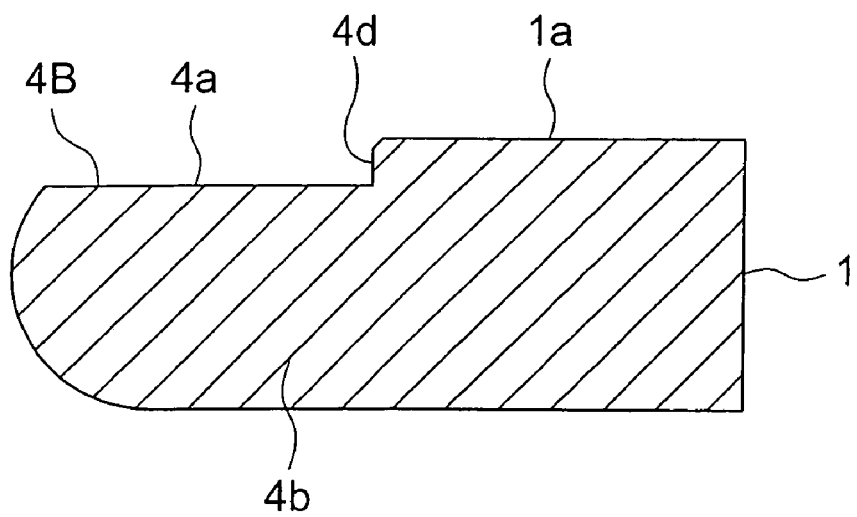
FIG. 5 is a partial cross sectional view showing a further example of a semiconductor wafer according to the first embodiment of the present invention.

Although in the above description, the separation portion of the above-mentioned semiconductor wafer 1 comprises the stepped portion 4 having the vertical plane 4b perpendicular to the bottom surface 4a, it may comprise a stepped portion 4A having a slope or inclined surface 4c formed at an angle with respect to a bottom surface 4a, as shown in FIG. 4. Further, the separation portion may comprise a stepped portion 4B having a chamfer 4d formed at a location at which a vertical plane 4b and a flat surface 1a cross each other, as shown in FIG. 5.

Figure 6:
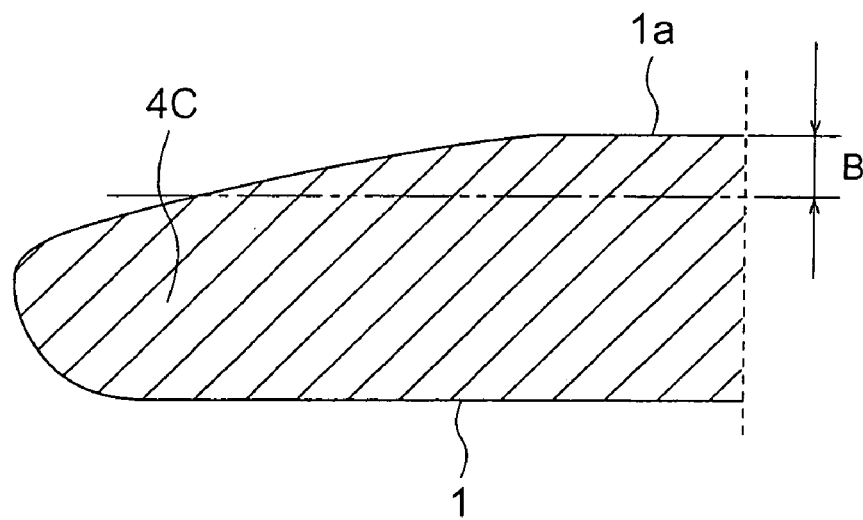
FIG. 6 is a partial cross sectional view showing a still further example of a semiconductor wafer according to the first embodiment of the present invention.

Furthermore, the semiconductor wafer 1 may have a thin wall portion 4C with its thickness gradually decreasing from the flat surface 1a toward the peripheral portion thereof, as shown in FIG. 6. In this case, by grinding the rear surface of the semiconductor wafer 1 fixedly attached to the support plate 3 to a prescribed thickness B, the thin wall portion 4C, which constitutes a separation portion having a notch, can be removed, and the diameter of the block 11 is decided by the diameter of the support plate 3 alone, as in the above-mentioned block 11, thereby providing the same operational effects as those obtained by the semiconductor wafer 1 previously described.

Figure 7:
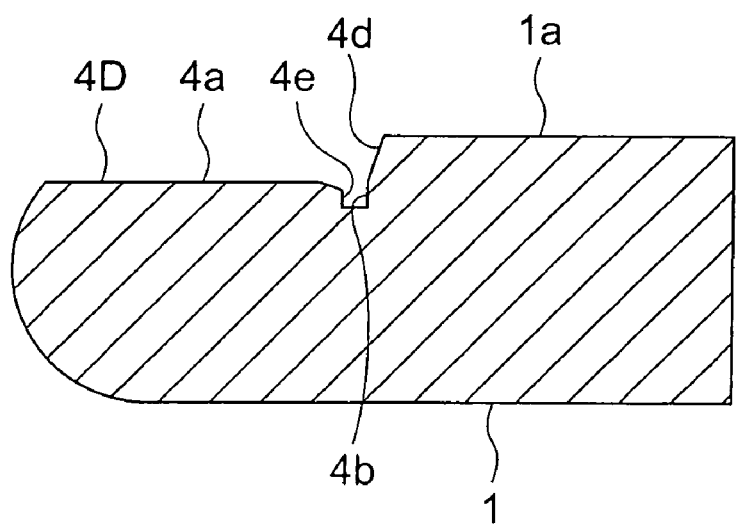
FIG. 7 is a partial cross sectional view showing a yet further example of a semiconductor wafer according to the first embodiment of the present invention.

Still further, as shown in FIG. 7, the separation portion may comprise a stepped portion 4D which has an annular groove 4e formed at an innermost diameter portion of the bottom surface 4a, and a chamfer 4d formed at a location at which a vertical plane 4b and a flat surface 1a cross each other.

Embodiment 2

FIGS. 8(I) through 8(IV) show those process steps of a method of manufacturing semiconductor devices according to a second embodiment of the present invention which are different from the ones in the above-mentioned first embodiment.

Although in the first embodiment, reducing the thickness of the peripheral portion of the semiconductor wafer 1 is carried out in advance before the semiconductor circuit 2 is formed on the flat surface 1a, it is necessary, according to this second embodiment, to decide the finished thickness of the semiconductor wafer 1 and the positioning or registering accuracy between the semiconductor wafer 1 and the support plate 3 before they are adhered to each other.

In actuality, there are many cases that the finished thickness of the semiconductor wafer 1 as required varies according to the kind and usage thereof. Accordingly, in cases where the manufacturing method as described in the first embodiment is adopted, it is necessary to prepare beforehand a variety of semiconductor wafers 1 with the processed configurations of their peripheral portions being changed in accordance with the kinds and uses thereof.

In contrast to this, according to this second embodiment, after the semiconductor circuit 2 has been formed on the flat surface 1a of the disk-shaped wafer main body 50, the stepped portion 4 of a prescribed depth is formed on the peripheral portion of the wafer main body 50 by a step forming process according to the usage-of the semiconductor circuit 2 (FIGS. 8(I) through 8(III)). Therefore, in cases where the finished thickness of the semiconductor wafer as required varies according to the kind and usage thereof, the operational effects similar to those obtained in the first embodiment can be achieved even if the stepped portion 4 of a specific size has not been prepared beforehand. Here, note that the respective process steps in this second embodiment after the manufacturing process step of FIG. 8(IV) are similar to the respective manufacturing process steps in the first embodiment shown in FIG. 2(IV) and in FIGS. 3(I) through 3(V), and hence an explanation thereof is omitted.

Embodiment 3

FIGS. 9(I) through 9(IV) show those process steps of a method of manufacturing semiconductor devices according to a third embodiment of the present invention which are different from the ones in the above-mentioned first embodiment.

Although in the above-mentioned second embodiment, the separation portion in the form of the stepped portion 4-is formed in the process step of FIG. 8(111), this third embodiment is different from the second embodiment in that an annular groove 26, being deeper than the thickness of the base 5 formed by grinding the rear surface of the semiconductor wafer 1, is formed, instead of the stepped portion 4, at a prescribed position of the peripheral portion of the semiconductor wafer 1 to provide a separation portion together with its outer periphery, as shown in FIG. 9(III).

In this example, after the support plate 3 is adhered to the semiconductor wafer 1 (FIG. 9(IV)), the rear surface of the semiconductor wafer 1 is ground (FIG. 9(V)), whereby the outer peripheral portion of the semiconductor wafer 1 outside the groove 26 is simultaneously separated to form the base 5 (FIG. 9(VI)). The subsequent manufacturing process steps of this third embodiment are similar to the respective process steps shown in FIG. 2(IV) and in FIGS. 3(I) through 3(VI), and the operational effects of this embodiment are also similar to those obtained by the above-mentioned second embodiment.

Embodiment 4

FIGS. 10(I) through 10(VIII) show those process steps of a method of manufacturing semiconductor devices according to a fourth embodiment of the present invention.

Although the semiconductor devices 30 have penetration electrodes 23 electrically connected with semiconductor circuits 2 formed on their front surfaces, these semiconductor devices 30 are produced from a wafer main body 50 through respective manufacturing process steps. Hereinafter, the respective manufacturing process steps will be explained in detail.

First of all, a semiconductor circuit 2 is formed on a flat surface 1a of the disk-shaped wafer main body 50 (FIG. 10(I)). Then, a plurality of holes 20 extending from the semiconductor circuit 2 to the wafer main body 50 are formed by means of etching, and at the same time a separation portion in the form of an annular stepped portion 4 is formed on the peripheral portion of the wafer main body 50 to provide a semiconductor wafer 1 (FIG. 10(II)). Thereafter, an electrically conductive material in the form of a metal is filled into the holes 20 to form electrode portions 21 (FIG. 10(III)). Then, a support plate 3 having substantially the same diameter as that of the semiconductor wafer 1 is adhered to a front surface of the semiconductor wafer 1 having the separation portion with a notch in the form of the stepped portion 4 by the use of an adhesive or binding material 7 (FIG. 10(IV)). After that, the rear surface of the semiconductor wafer 1 is partially ground to remove the stepped portion 4 until the thickness of the semiconductor wafer 1 is reduced to a finished thickness of about 1/10 of the initial thickness thereof, so that a base 5 is thereby formed. In this connection, note that the depth of the stepped portion 4 is the same as the depth of the holes 20, so one end faces of the electrode portions 21 are exposed outward from the base 5 at the same time with the removal of the stepped portion 4 (FIG. 10(V)). Subsequently, the rear surface of the base 5 is etched to protrude the electrode portions 21 therefrom (FIG. 10(VI)), after which a process of forming an insulating film 24 on the rear surface of the base 5 is carried out, and then a metal is attached to the one end faces of the electrode portions 21 to form the penetration electrodes 23, whereby a block 31 having semiconductor devices 30 are formed (FIGS. 10(VII) and 10(VIII)).

Thereafter, the semiconductor devices 30 are separated from the block 31 by ultraviolet radiation, as in the above-mentioned first through third embodiments.

In the semiconductor devices 30 having the penetration electrodes 23, the annular stepped portion 4 is formed on the peripheral portion of the wafer main body 50 at the same time when the holes 20 are formed through the wafer main body 50 by means of the etching process, as a result of which there is no necessity of particularly or independently providing a process step of forming the stepped portion 4. In addition, the conveyance or transportation system for the semiconductor wafer 1 having the semiconductor circuit 2 formed on the front surface thereof can be used as it is, even in the respective process steps following the process step of forming the base 5 (FIG. 10(V)).

Moreover, the diameter of the block 31, after the rear surface of the semiconductor wafer 1 has been ground to protrude the penetration electrodes 23 therefrom, becomes the diameter of the support plate 3. Therefore, the dimensional accuracy of the diameter of the block 31 is decided by the dimensional accuracy of the diameter of the support plate 3, and hence the accuracy of the semiconductor wafer 1 and the positioning or registering accuracy between the semiconductor wafer 1 and the support plate 3 are relaxed or mitigated.

Furthermore, since the depth of the notch or the stepped portion 4 is the same as the depth of the holes 20 in the wafer main body 50, the one end faces of the electrode portions 21 can be exposed from the wafer main body 50 at the same time with the grinding of the stepped portion 4, whereby the removal of the stepped portion 4 and the exposure of the one end faces of the electrode portions 21 can be carried out by one and the same process step, thus making it possible to improve the manufacturing efficiency.

Embodiment 5

Figure 11A:
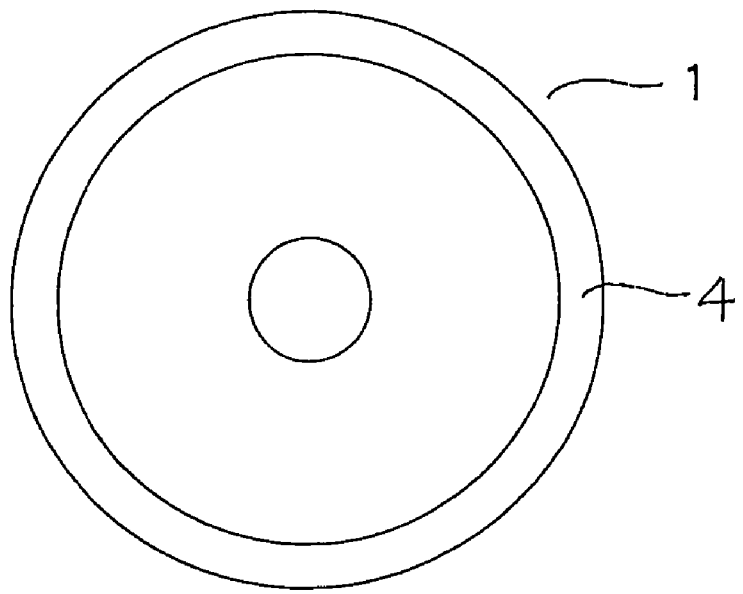
FIG. 11A is a plan view of a semiconductor wafer of a different configuration.
Figure 11B:
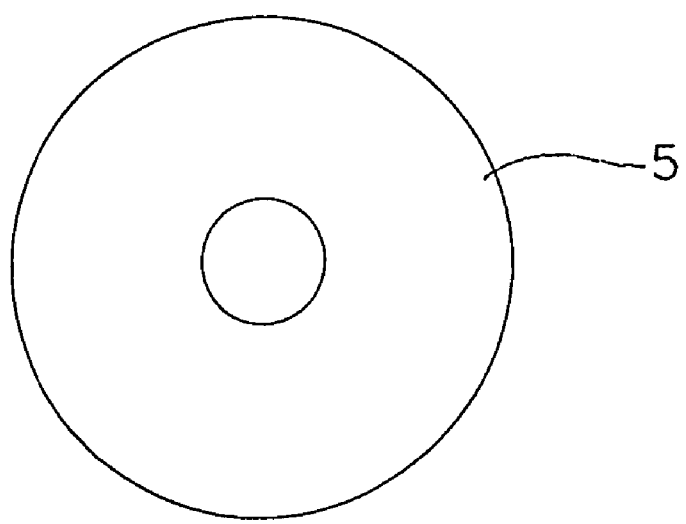
FIG. 11B is a plan view of a base after the semiconductor wafer of FIG. 11A is partially removed by grinding.
Figure 12A:
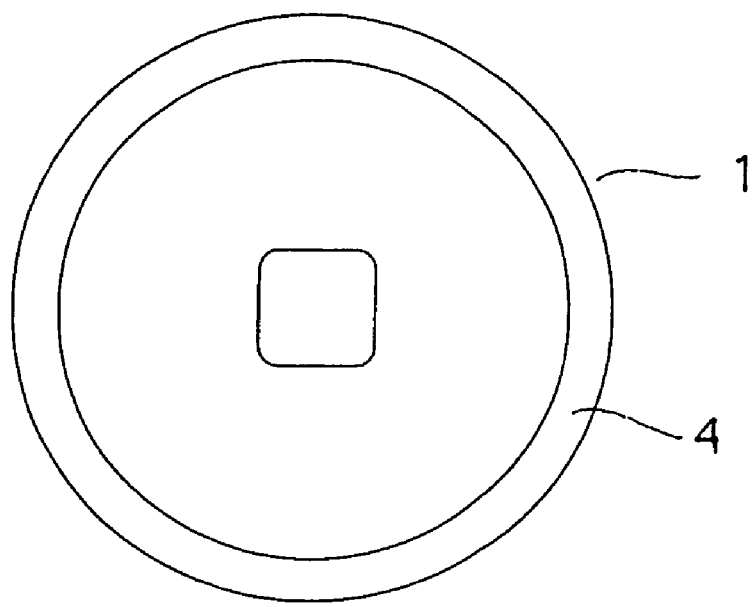
FIG. 12A is a plan view of a semiconductor wafer of a further different configuration.
Figure 12B:
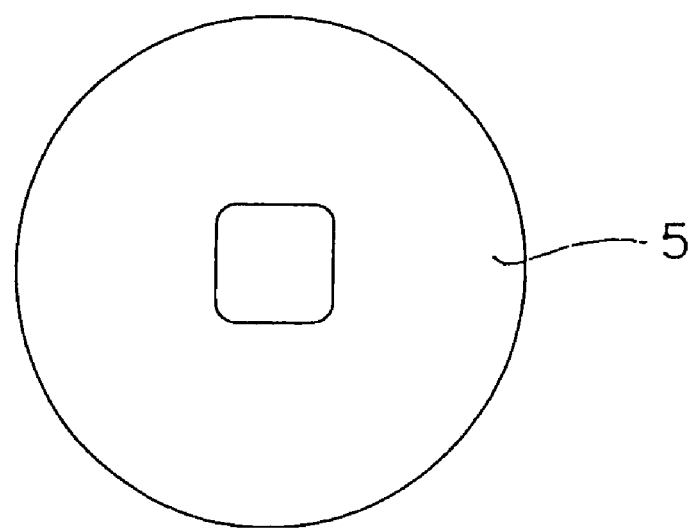
FIG. 12B is a plan view of a base after the semiconductor wafer of FIG. 12A is partially removed by grinding.
Figure 13A:
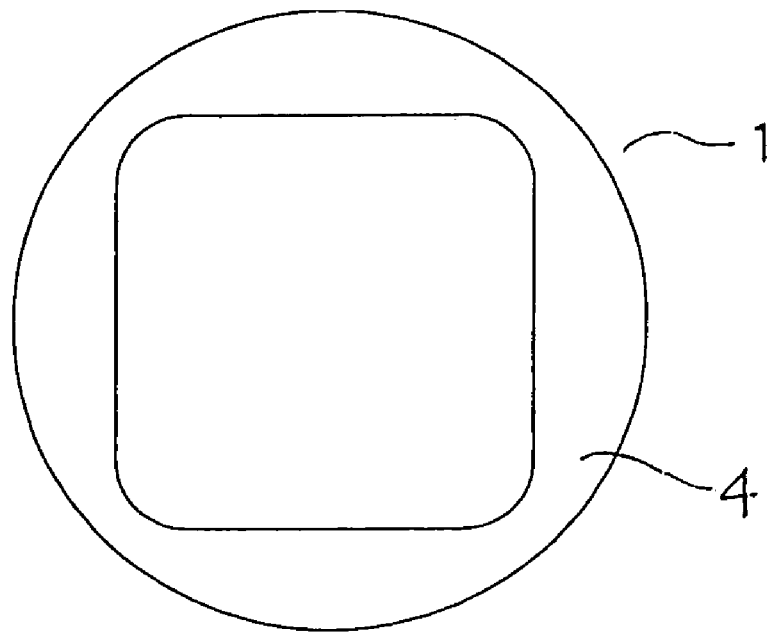
FIG. 13A is a plan view of a semiconductor wafer of a still further different configuration.
Figure 13B:
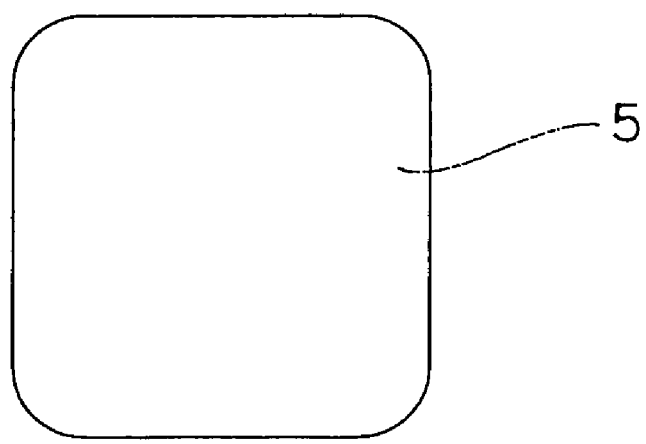
FIG. 13B is a plan view of a base after the semiconductor wafer of FIG. 13A is partially removed by grinding.
Figure 14A:
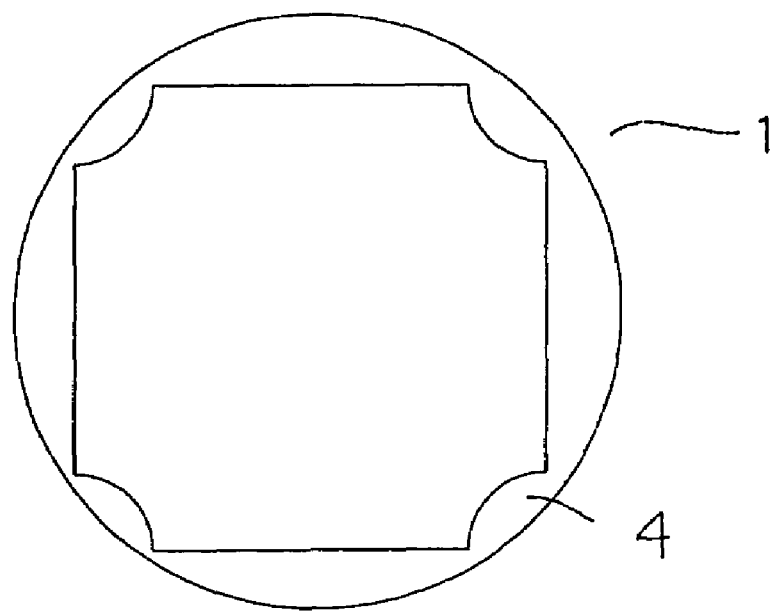
FIG. 14A is a plan view of a semiconductor wafer of a yet further different configuration.
Figure 14B:
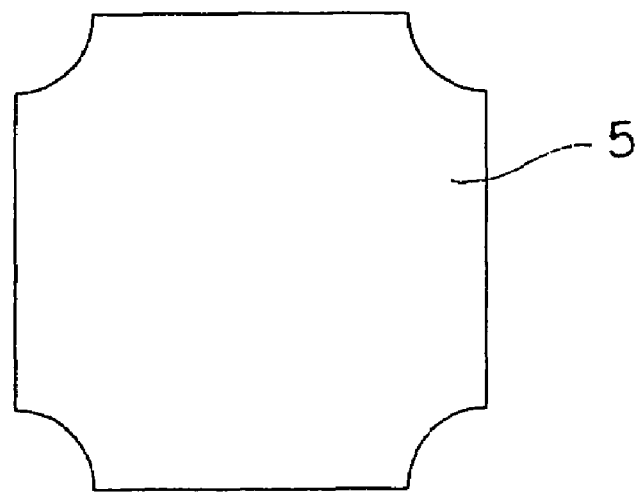
FIG. 14B is a plan view of a base after the semiconductor wafer of FIG. 14A is partially removed by grinding.

Although in the above-mentioned respective embodiments, the semiconductor wafer 1 of a disk-shaped configuration has been described, the present invention is also applicable to a semiconductor wafer 1 with a base 5, which takes a doughnut-shaped configuration after the rear surface of the semiconductor wafer 1 has been removed by grinding, as shown in FIGS. 11A and 11B and in FIGS. 12A and 12B. In addition, the present invention is further applicable to another semiconductor wafer 1, too, even if the configuration of the base 5 of the semiconductor wafer 1, after the rear surface thereof has been partially removed by grinding, is substantially quadrangular, as shown in FIGS. 13A and 13B and FIGS. 14A and 14B.

Figure 15A:
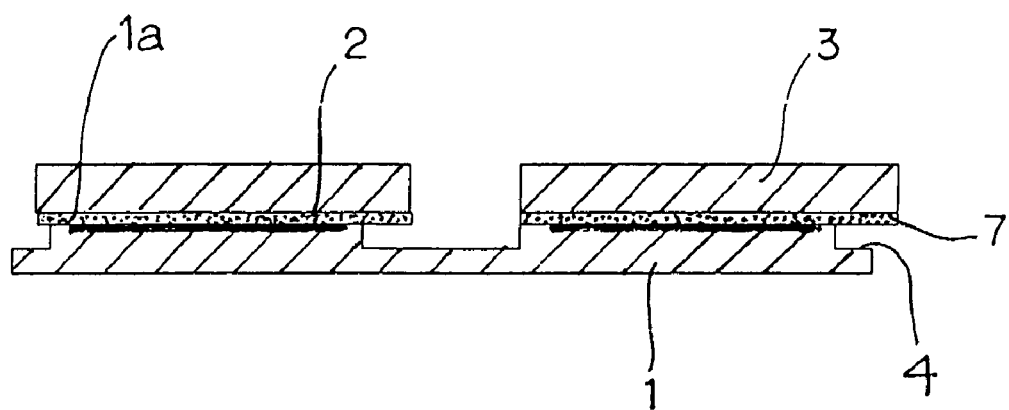
FIG. 15A is a cross sectional view showing one process step of manufacturing semiconductor devices by using the semiconductor wafer shown in FIG. 11A.
Figure 15B:
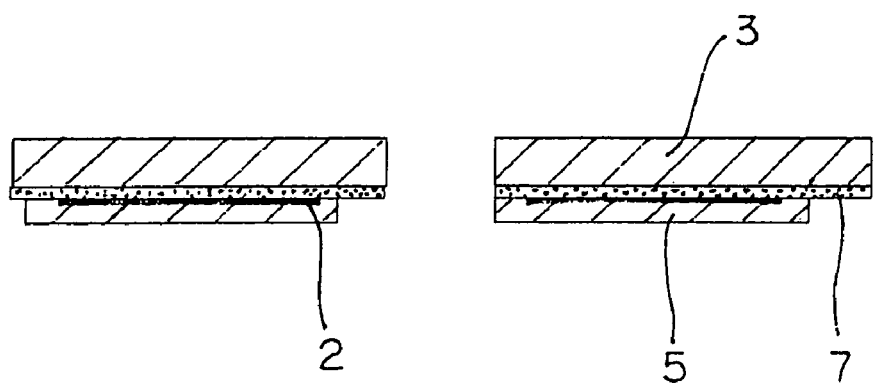
FIG. 15B is a cross sectional view showing a process step following the one of FIG. 15A.

For instance, when semiconductor devices 12 are manufactured by the use of the semiconductor wafer 1 as shown in FIG. 11A, a semiconductor circuit 2 is formed, in the course of manufacture, on a flat surface 1a of one or front surface of the semiconductor wafer 1 that has a separation portion in the form of a stepped portion 4 formed by subjecting the peripheral portion of a disk-shaped wafer main body at its front surface side to a step forming process. Thereafter, a support plate 3 having substantially the same diameter as that of the semiconductor wafer 1 is adhered to the front surface of the semiconductor wafer 1 by using a binding material 7 (FIG. 15A). Subsequently, the rear surface of the semiconductor wafer 1 is partially ground to remove the separation portion in the form of the stepped portion 4 until the thickness of the semiconductor wafer 1 is reduced to a prescribed finished thickness, thereby forming a base 5 (FIG. 15B). The following process steps are similar to the ones explained in the first embodiment.

As can be seen from the foregoing description, the present invention provides the following excellent advantages.

According to one aspect of the present invention, there is provided a semiconductor wafer having a front surface which is a flat surface with a semiconductor circuit formed thereon and to which a support plate is adhered, and a rear surface of which is partially removed to reduce its thickness. On a peripheral portion of the semiconductor wafer, there is formed a separation portion which has a notch deeper than a finished thickness of the semiconductor wafer obtained by the partial removal of the rear surface thereof. The separation portion has a length which extends radially outward from the flat surface, and which is greater than a total sum of a maximum-minimum difference between the finish allowances of the diameters of the semiconductor wafer and the support plate, which has substantially the same diameter as that of the semiconductor wafer, and a maximum value of a positioning error between the semiconductor wafer and the support plate generated at the time of adhering them to each other. With this construction, even after the semiconductor wafer and the support plate have been adhered to each other, it is possible to use a conveyance system as before without changing it in any way, and at the same time to relax the finish accuracy of the semiconductor wafer as well as the positioning or registering accuracy between the semiconductor wafer and the support plate. As a result, the efficiency of manufacturing semiconductor devices can be improved.

According to another aspect of the present invention, there is provided a semiconductor device formed by dividing a semiconductor device body into a plurality of semiconductor devices, the semiconductor device body comprising: a base formed by partially removing the rear surface of the above-mentioned semiconductor wafer thereby to eliminate the separation portion of the semiconductor wafer; and a semiconductor circuit formed on one surface of the base. The semiconductor device of this construction can improve the manufacturing efficiency thereof.

According to a further aspect of the present invention, there is provided a method of manufacturing semiconductor devices, the method comprising the steps of: forming the separation portion of the above-mentioned semiconductor wafer on a peripheral portion of a wafer main body at a front surface side thereof to provide the semiconductor wafer; forming a semiconductor circuit on the flat surface of the front surface of the semiconductor wafer; adhering a support plate of substantially the same diameter as that of the semiconductor wafer to the front surface of the semiconductor wafer by means of a binding material; partially removing the rear surface of the semiconductor wafer to eliminate the separation portion thereby to form a base; and processing a rear surface of the base. With this method, even after the semiconductor wafer and the support plate have been adhered to each other, a conveyance system can be used as before without any change, and the finish accuracy of the semiconductor wafer and the positioning or registering accuracy between the semiconductor wafer and the support plate can be relaxed. Accordingly, the efficiency of manufacturing semiconductor devices can be improved. In addition, since the size of the base is smaller than that of the support plate, separation workability in separating the support plate from the base can be improved.

According to a further aspect of the present invention, there is provided a method of manufacturing semiconductor devices, the method comprising: forming a semiconductor circuit on a flat surface of a front surface of a wafer main body; forming the separation portion of the above-mentioned semiconductor wafer on a peripheral portion of the wafer main body at a front surface side thereof to provide the semiconductor wafer; adhering a support plate of substantially the same diameter as that of the semiconductor wafer to the front surface of the semiconductor wafer by means of a binding material; partially removing the rear surface of the semiconductor wafer to eliminate the separation portion thereby to provide a base; and processing a rear surface of the base. With this method, even after the adhesion of the semiconductor wafer and the support plate to each other, a conveyance system can be used as before without any change, and the finish accuracy of the semiconductor wafer and the positioning or registering accuracy between the semiconductor wafer and the support plate can be relaxed, as a result of which the efficiency of manufacturing semiconductor devices can be improved.

In addition, since the size of the base is smaller than that of the support plate, separation workability in separating the support plate from the base can be improved.

Further, in cases where the finished thickness of the semiconductor wafer as required varies according to the kind and usage thereof, it is not necessary to prepare any separation portion of a specific size beforehand.

According to a still further aspect of the present invention, there is provided a method of manufacturing semiconductor devices, the method comprising the steps of: forming a semiconductor circuit on a flat surface of a front surface of a wafer main body; forming a plurality of holes that extend from the semiconductor circuit to the wafer main body; forming the separation portion of the above-mentioned semiconductor wafer on a peripheral portion of the wafer main body to provide the semiconductor wafer; filling a conductive material into the holes to form electrode portions; adhering a support plate of substantially the same diameter as that of the semiconductor wafer to the front surface of the semiconductor wafer by means of a binding material; partially removing the rear surface of the semiconductor wafer to eliminate the separation portion thereby to form a base and to expose one end faces of the electrode portions; partially removing a rear surface of the base to protrude the electrode portions therefrom; forming an insulating film on the rear surface of the base; and processing the one end faces of the electrode portions to form penetration electrodes. With this method, even after the adhesion of the semiconductor wafer and the support plate to each other, it is possible to use a conveyance system as before without any change thereof, and at the same time to relax the finish accuracy of the semiconductor wafer as well as the positioning or registering accuracy between the semiconductor wafer and the support plate, as a consequence of which the efficiency of manufacturing semiconductor devices can be improved.

While the invention has been described in terms of preferred embodiments, those skilled in the art will recognize that the invention can be practiced with modifications within the spirit and scope of the appended claims.

What is claimed is:

1. A semiconductor wafer comprising:
   a front surface and an opposing rear surface,
   the front surface comprising a flat central portion and
   a peripheral portion surrounding the flat central portion, wherein
   a semiconductor circuit is formed in the flat central potion and
   the peripheral portion comprises a stepped portion having vertical surface formed at an outer edge of the flat central portion, a front surface of the stepped portion formed horizontally to the vertical surface, an annular groove formed in the horizontally formed front surface at the vertical surface, and a chamfer formed where the vertical surface and the flat central portion meet.

* * * * *

UNITED STATES PATENT AND TRADEMARK OFFICE
CERTIFICATE OF CORRECTION

PATENT NO. : 7,709,932 B2
APPLICATION NO. : 11/245059
DATED : May 4, 2010
INVENTOR(S) : Yoshihiko Nemoto et al.

It is certified that error appears in the above-identified patent and that said Letters Patent is hereby corrected as shown below:

On the title page, item (73) Assignee reads, Renesas Technology Corp., Tokyo (JP), it should read, Shinko Electric Industries, Nagano (JP); Renesas Electronics Corporation, Kanagawa (JP) and Kabushiki Kaisha Toshiba, Tokyo (JP)

Signed and Sealed this
Twenty-sixth Day of April, 2011

David J. Kappos
*Director of the United States Patent and Trademark Office*